US012776640B2

(12) United States Patent
Thoma et al.

(10) Patent No.: US 12,776,640 B2
(45) Date of Patent: Oct. 27, 2026

(54) POWER TRANSISTOR CONTROL AND OVERCURRENT DETECTION

(71) Applicant: Infineon Technologies AG, Neubiberg (DE)

(72) Inventors: Christof Marc Thoma, Villach (AT); Alexander Mayer, Treffen (AT); Daniel Mayer, Ranten (AT)

(73) Assignee: Infineon Technologies AG, Neubiberg (DE)

( * ) Notice: Subject to any disclaimer, the term of this patent is extended or adjusted under 35 U.S.C. 154(b) by 59 days.

(21) Appl. No.: 19/008,994

(22) Filed: Jan. 3, 2025

(65) Prior Publication Data

US 2025/0219389 A1 Jul. 3, 2025

(30) Foreign Application Priority Data

Jan. 3, 2024 (DE) ......................... 102024100120.8

(51) Int. Cl.
*H02H 3/093* (2006.01)
*H03K 17/082* (2006.01)

(52) U.S. Cl.
CPC ....... *H02H 3/0935* (2013.01); *H03K 17/0822* (2013.01)

(58) Field of Classification Search
CPC ............... H02H 3/0935; H03K 17/081; H03K 17/0822; H03K 17/687; H03K 19/0013
USPC .......................................................... 361/93.1
See application file for complete search history.

(56) References Cited

U.S. PATENT DOCUMENTS 6,985,343 B2 * 1/2006 Mirowski ................. G06F 1/28 361/93.2
2021/0083659 A1 * 3/2021 Mayer ..................... H03K 17/18
2023/0187922 A1 * 6/2023 Randazzo ............ H02H 1/0007 361/87

* cited by examiner

*Primary Examiner* — Kevin J Comber
(74) *Attorney, Agent, or Firm* — Slater Matsil, LLP

(57) ABSTRACT

In accordance with an embodiment, a circuit includes a power transistor connected between a supply terminal and an output terminal; a control circuit coupled to a control electrode of the power transistor and configured to apply a control current to the control electrode to turn the power transistor on or off; and an overcurrent protection circuit connected to the power transistor. The circuit is configured to operate in a first mode, in which some functions of the circuit are inactive to reduce power consumption, and in a second mode, in which all functions of the circuit are active. The overcurrent protection circuit is configured to: in response to the circuit being in the first mode and a sense signal indicative of a load current passing through the power transistor reaching a first threshold, cause the circuit to change from the first mode to the second mode.

21 Claims, 5 Drawing Sheets

POWER TRANSISTOR CONTROL AND OVERCURRENT DETECTION

This application claims the benefit of German Patent Application No. 102024100120.8, filed on Jan. 3, 2024, which application is hereby incorporated herein by reference.

TECHNICAL FIELD

This application relates to the field of electronic circuits and, in particular, to power transistor control and overcurrent detection.

BACKGROUND

So-called intelligent semiconductor switches or smart switches are integrated circuits which include, besides the semiconductor switch as such (usually a power transistor), additional circuits that are configured to perform various auxiliary functions such as current measurement, temperature measurement, current limitation, circuit diagnosis, digital communication with other circuits, etc. Some of these auxiliary functions are implemented to protect the integrated circuit from being operated outside its safe operation area (SOA). Overcurrent switch-off and current limitation are examples of such protective functions and are a requirement for many applications.

Intelligent semiconductor switches may be used, for example, in automotive applications to protect electronic circuits or devices from too high currents, thereby replacing traditional fuses. However, the own current consumption of these intelligent switches can be relatively high, which can be a problem, for example, when a vehicle is parked because the overall current consumption has to be low in order to avoid excessively discharging the battery.

In order to reduce the power consumption of the smart switch, a so-called idle-mode may be introduced, which is a low power mode in which the electronic switch is switched on but only some of the functions of the intelligent switch are active. In particular, the precise current measurement and the conventional overcurrent protection of the power switch, which have a relatively high power consumption, should be inactive in idle-mode.

However, the transition from idle-mode to normal-mode when the vehicle is started after parking takes a certain amount of time, during which the power transistor and the smart switch would not be protected by the conventional overcurrent protection. In this period of time, fast rising load current transients, typically due to short circuits, could occur and harm the device.

SUMMARY

The above-mentioned objective is achieved by using an emergency overcurrent circuit that is active in the idle-mode and that fulfills the low supply current requirements. This emergency overcurrent circuit is able to quickly react to fast current transients in the idle-mode and protects the power transistor during the transition from the idle-mode to the normal-mode until the conventional overcurrent protection is available after a mode change to active-mode (normal-mode). To avoid any interaction with application relevant load current changes, only fast transients, which reflect a short circuit, are detected and lead to a protective switch-off.

In one example, the disclosure is directed to a circuit comprising a power transistor connected between a supply terminal and an output terminal, a control circuit coupled to a gate electrode of the power transistor and configured to apply a gate current to the gate electrode to turn the power transistor on or off, and an overcurrent protection circuit that is connected to the power transistor. The circuit can be in a first mode, in which some functions of the circuit are inactive to reduce power consumption, and in a second mode, in which all functions of the circuit are active. The overcurrent protection circuit is configured to, when the circuit is in the first mode and a sense signal indicative of a current passing through the power transistor has reached a first threshold, cause the circuit to change from the first mode to the second mode, which requires a specific transition time beginning at the sense signal reaching the first threshold. The overcurrent protection circuit is further configured to, when the sense signal has reached a second threshold and the transition time is not over, output, during the transition time, a discharge signal that leads to a reduction of the gate current that is applied to the gate electrode.

In one example, the disclosure is directed to a method comprising the steps of: switching on and off a power transistor of a circuit according to a gate current that is applied to a gate electrode of the power transistor, wherein the circuit can be in a first mode, in which some functions of the circuit are inactive to reduce power consumption, and in a second mode, in which all functions of the circuit are active; detecting, when the circuit is in the first mode, that a sense signal indicative of a load current passing through the power transistor has reached a first threshold, and, in response thereto, changing the circuit from the first mode to the second mode, wherein the change from the first mode to the second mode requires a specific transition time that begins with the sense signal reaching the first threshold; and detecting that the sense signal has reached a second threshold, and, in response thereto, outputting, during the transition time, a discharge signal which causes the reduction of the control current that is applied to the control electrode.

BRIEF DESCRIPTION OF THE DRAWINGS

The embodiments described herein can be better understood with reference to the following description and drawings. The components in the figures are not necessarily to scale, emphasis instead being placed upon illustrating the principles of the embodiments. Furthermore, in the figures, like reference numerals designate corresponding parts. In the drawings.

DETAILED DESCRIPTION OF ILLUSTRATIVE EMBODIMENTS

Some embodiments are directed to intelligent semiconductor switches and/or to an intelligent semiconductor switch having an idle-mode state. In some embodiments, an intelligent semiconductor switch circuit includes a power transistor, which is capable of efficiently protecting the power transistor from overcurrents during an idle-mode.

Before various embodiments are described in more detail, an example of a conventional intelligent semiconductor switch (smart switch) 100 is described with reference to FIG. 1. The example described herein relates to high-side switches, which are connected between a supply voltage terminal and an electric load. However, it is understood that the concepts described herein are readily applicable to low-side switches.

Figure 1:
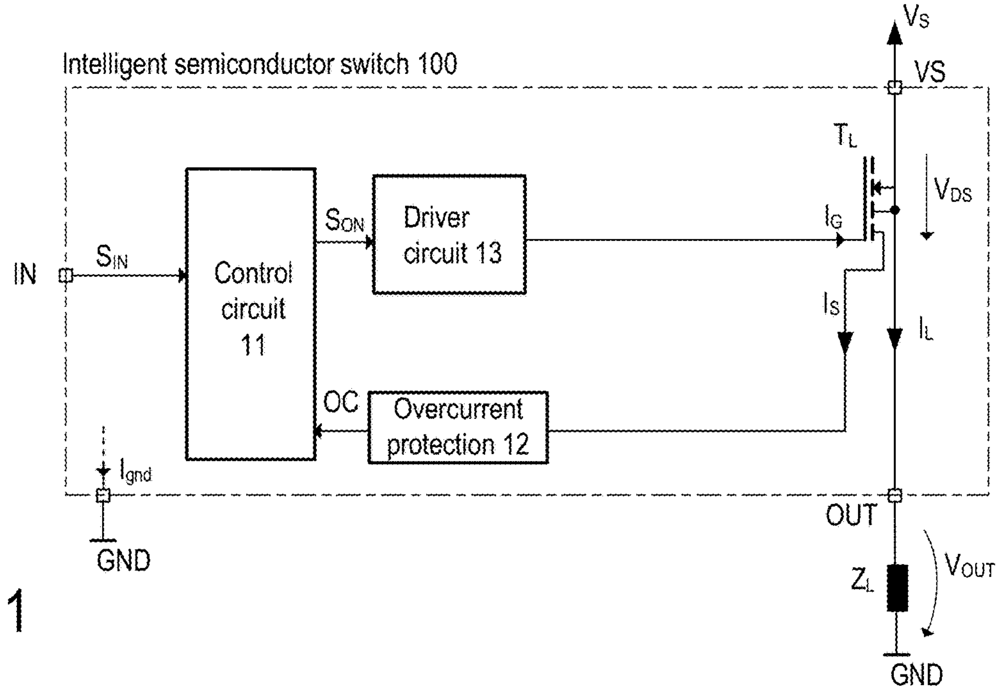
FIG. 1 illustrates one example of an intelligent semiconductor switch with an overcurrent protection function.

In the example of FIG. 1, the intelligent semiconductor switch 100 has (inter alia) a supply terminal VS, at which a supply voltage $V_S$ is applied, and an output terminal OUT, to which an electric load $Z_L$ is connected during operation. A power transistor $T_L$ (i.e. its load current path to be precise) can connect and disconnect the supply terminal VS and the output terminal OUT dependent on a control signal $S_{ON}$. In the present example, the power transistor $T_L$ is an n-channel MOS field-effect transistor (MOSFET) whose drain electrode is connected to the supply terminal VS and whose source electrode is connected to the output terminal OUT. In case of a MOSFET the mentioned control signal $S_{ON}$ is converted to a suitable gate current $I_G$ or gate voltage which is supplied to the gate electrode of the MOSFET. In the present example, the electric load is symbolized by an impedance $Z_L$ that is connected between the output terminal OUT and a reference (e.g. ground) potential GND. The voltage across the electric load $Z_L$ is denoted as $V_{OUT}$ (which is equal to the source voltage of the transistor $T_L$). The control signal $S_{ON}$ is generated by a control circuit 11 based on an input signal $S_{IN}$ that may be received at an input terminal IN of the intelligent semiconductor switch 100. The switch 100 also comprises a driver circuit 13 that is configured to receive the control signal $S_{ON}$ from the control circuit 11 and to generate the mentioned gate current $I_G$ or gate voltage for the power transistor $T_L$. In the example of FIG. 1 the input signal $S_{IN}$ is a logic signal received at an input pin IN from an external controller. In other embodiments, the input signal $S_{IN}$ may be received via a digital communication interface such as, for example, a Serial Peripheral Interface (SPI). In one embodiment, the input signal $S_{IN}$ may be generated (e.g. by the communication interface) based on a command received via a bus line connected to the digital communication interface. In case of an SPI the bus line may be a so-called MOSI (Master-Out/Slave-In) line.

The intelligent semiconductor switch 100 of FIG. 1 further comprises an overcurrent protection circuit 12 that may be configured to limit the load current $I_L$ when the switch 100 operates in normal-mode (active-mode) so that the load current $I_L$ does not exceed a specified current limit, in particular in short-circuit or overload conditions.

In some examples, an over-current switch-off is implemented in addition to a current limitation. In the present example, the overcurrent protection circuit 12 is coupled to a sense electrode of the power transistor $T_L$ which provides a sense current $I_S$, which is indicative of the load current $I_L$ passing through the power transistor. The conventional overcurrent protection circuit 12 is further configured to generate a protection signal OC which is received by the control circuit 11. The protection signal OC is a logic signal, wherein, for example, a High level indicates the detection of an overcurrent, whereupon the control circuit 11 outputs a signal (as control signal $S_{ON}$) to the driver circuit 13 that leads to the mentioned over-current switch-off.

It is understood that the intelligent semiconductor switch also comprises a plurality of other circuits, such as an overvoltage clamping circuit and/or an overtemperature circuit, which are not shown in FIG. 1 for clarity reasons but are well-known to a person skilled in the art. Further it is noted that transistors with a separate source electrode that can be used as sense electrode for the purpose of current measurement are also well-known and thus not further discussed herein in more detail. Usually, the power transistor is composed of a plurality of transistor cells connected in parallel. A small fraction of the transistor cells are connected to the sense electrode, wherein the ratio $k=I_L/I_S$ between load current $I_L$ and sense current $I_S$ is approximately equal to the ratio of transistor cells connected to the "normal" source electrode (providing the load current $I_L$) and the sense electrode (providing the sense current $I_S$).

In certain situations, for example when a vehicle is parked, the own current consumption (represented by $I_{gnd}$ in FIG. 1) of the intelligent semiconductor switch has to be kept low. This can be done by operating the control circuit 11 (and thus the whole smart switch) in an idle-mode (also referred to as first mode in the application), in which the power transistor $T_L$ is on but a plurality of functions (and additional circuits) of the smart switch are disabled in order to reduce the current consumption $I_{gnd}$. In particular, the conventional overcurrent protection 12, as well as the current measurement, may be disabled. This means that no conventional overcurrent protection is available during the idle-mode.

Because of the intrinsic reaction times of the different circuits and of the propagation delays introduced by the circuits when they send signals, a transition from idle-mode to normal-mode does not occur immediately. Instead, it takes a certain amount of time (mode transition time $t_{transition}$), during which the conventional overcurrent protection 12 is not available and fast rising load current transients, typically due to short circuits, may occur and harm the device during the transition time period.

Figure 2:
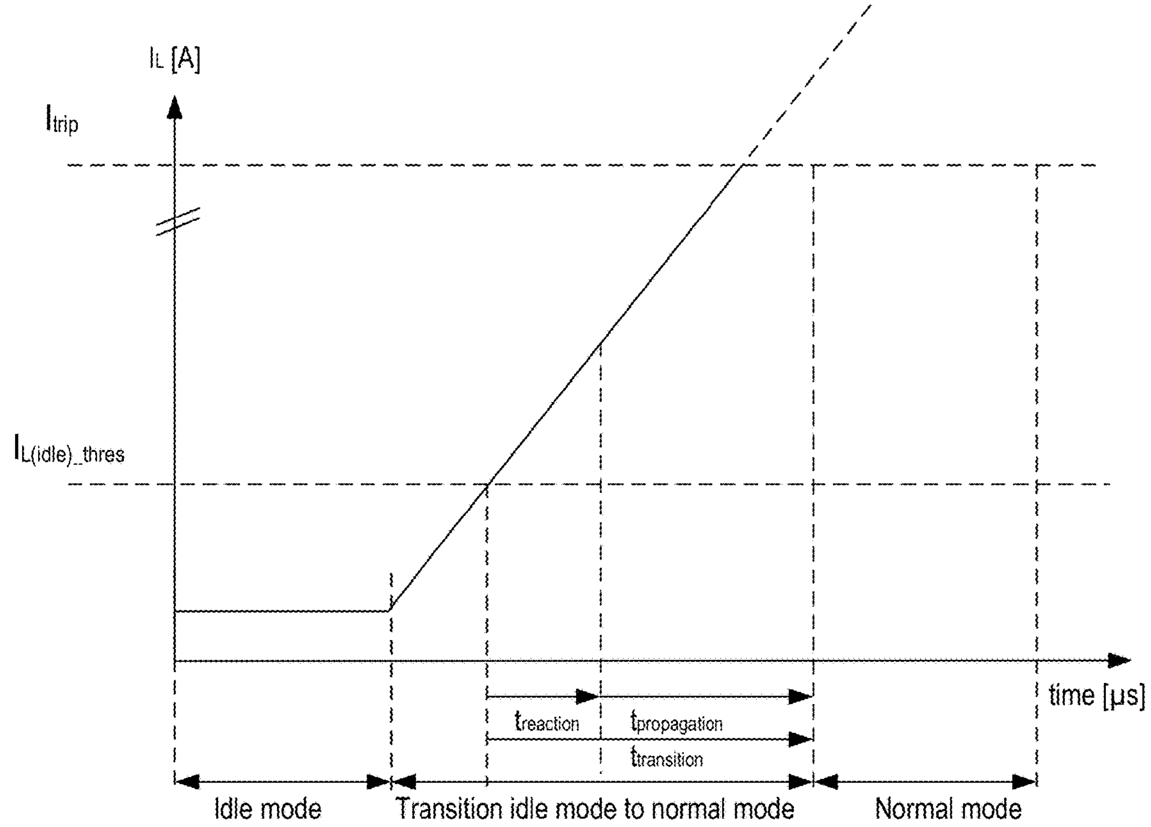
FIG. 2 illustrates a timing diagram illustrating the behavior of the load current in the intelligent semiconductor switch of FIG. 1 during a transition between an idle-mode and an active mode.

This problem is further illustrated in FIG. 2 of the application. FIG. 2 shows the behavior of the load current $I_L$ depending on the time, during a transition from an idle-mode to a normal-mode. When the load $Z_L$ becomes active (e.g. when the vehicle is started after parking), the load current $I_L$ increases. When the load current $I_L$ reaches a first threshold $I_{L(idle)\_thres}$, a corresponding signal (wake-up signal) is sent to the control circuit 11 which initiates the transition from the idle-mode to the normal-mode. At the end of the transition, all the circuits of the smart switch are active, in particular the overcurrent protection 12. As mentioned, this requires a certain mode transition time $t_{transition}$, which depends on the reaction time $t_{reaction}$ of the control circuit and the additional circuits of the smart switch, and on the propagation time $t_{propagation}$ that is necessary to send and receive the different signals that are necessary to activate the inactive functions of the smart switch. In the present example, the reaction time $t_{reaction}$ is 6 μs and the propagation time $t_{propagation}$ is 9.5 μs, so that the total mode transition time $t_{transition}$ is 15.5 μs. However, during this transition time, very fast current load transients may occur, e.g. with slopes of 20 A/μs or even 50 A/μs. This means that, at the end of the mode transition time period, the load current may reach 250 A or even 800 A, and thus by far exceed the threshold current $I_{trip}$, which is used to trigger an overcurrent switch-off and which typically is around 135 A. It thus cannot be excluded that the smart switch and its power transistor be harmed during the mode transition time, which should be avoided. As a reduction of the mode transition time $t_{transition}$ is usually not feasible, an additional overcurrent protection is needed in idle-mode.

A first possibility would be to keep the conventional overcurrent protection active in the idle-mode, which has a good accuracy. However, this would lead to a significant higher current consumption $I_{gnd}$ which is not compatible with the low current requirements of the idle-mode.

A further possibility would be to add a conventional low power overcurrent protection circuit that is able to operate with low power consumption. However, the known circuits lack accuracy and would not be able to fulfill the overcurrent requirements because the performance of the protection stage is limited by the current consumption.

Figure 3:
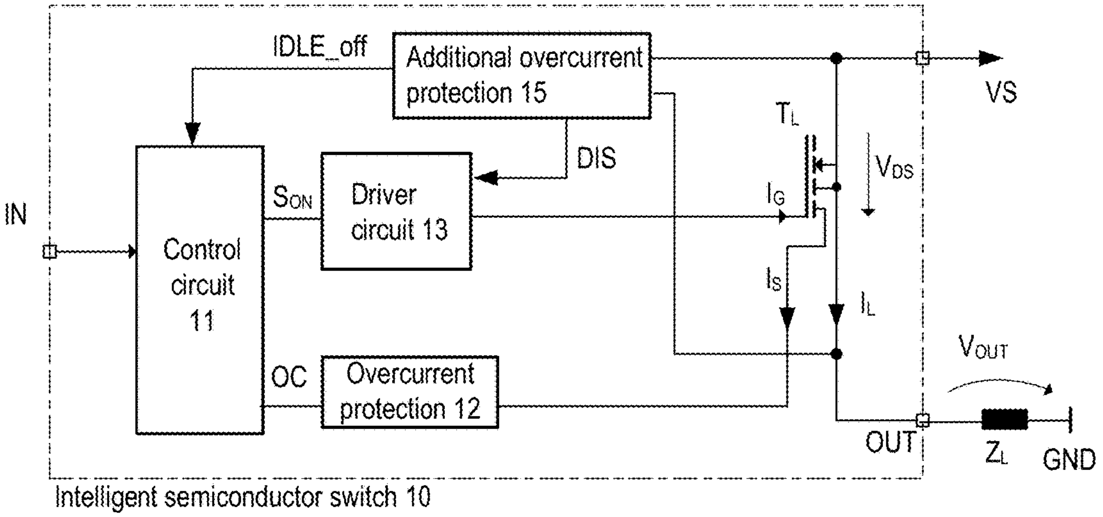
FIG. 3 illustrates one example of an intelligent semiconductor switch with a current limitation function in accordance with one or more techniques described herein.

FIG. 3 illustrates an example of an intelligent semiconductor switch 10, which can be regarded as a modification/improvement of the example of FIG. 1. In this example, the smart switch circuit 10 comprises an additional overcurrent protection circuit 15 (emergency overcurrent protection). The additional overcurrent protection circuit 15 is connected to the power transistor $T_L$ such that it can (e.g. indirectly) sense the load current $I_L$ passing through the power transistor (or a quantity that is indicative of the load current). It is configured to react to fast load current transients when the smart switch 10 is in idle-mode. In particular, it is able to distinguish between a short circuit condition, which results in fast current transients, and a normal load change, which results in slower current transients. The additional overcurrent protection circuit 15 has a very low current consumption and fulfills the low current restriction in the idle-mode.

When a fast transient event is detected, the additional overcurrent protection circuit 15 sends a signal to the driver circuit 13 that leads to a switching off of the power transistor $T_L$ within a short period of time, and thus to an almost immediate decrease of the load current $I_L$. The additional overcurrent protection circuit 15 is further configured to generate a signal IDLE_off that is received by the control circuit 11 and leads to a change of the control circuit 11 and of the smart switch 10 from the idle-mode to the normal-mode.

The additional overcurrent protection circuit 15 has a reaction time that is significantly quicker than the transition time $t_{transition}$ that is required by the conventional overcurrent protection circuit 12 to be fully operational. The additional overcurrent protection circuit 15 thus ensures that the power transistor $T_L$ of the smart switch 10 be protected in the transition phase between the idle-mode and the normal-mode when the conventional overcurrent protection circuit 12 is not yet active, as is explained in further details below.

In the idle-mode, the conventional overcurrent protection circuit 12 is inactive, while the additional overcurrent protection 15 is active. During the transition between the idle-mode and the normal-mode, the additional overcurrent protection circuit 15 protects the switch against fast transient overcurrent conditions until the conventional overcurrent protection 12 is fully operational. In the normal-mode, only the conventional overcurrent protection circuit 12 is active and the additional overcurrent protection 15 is inactive.

Figure 4:
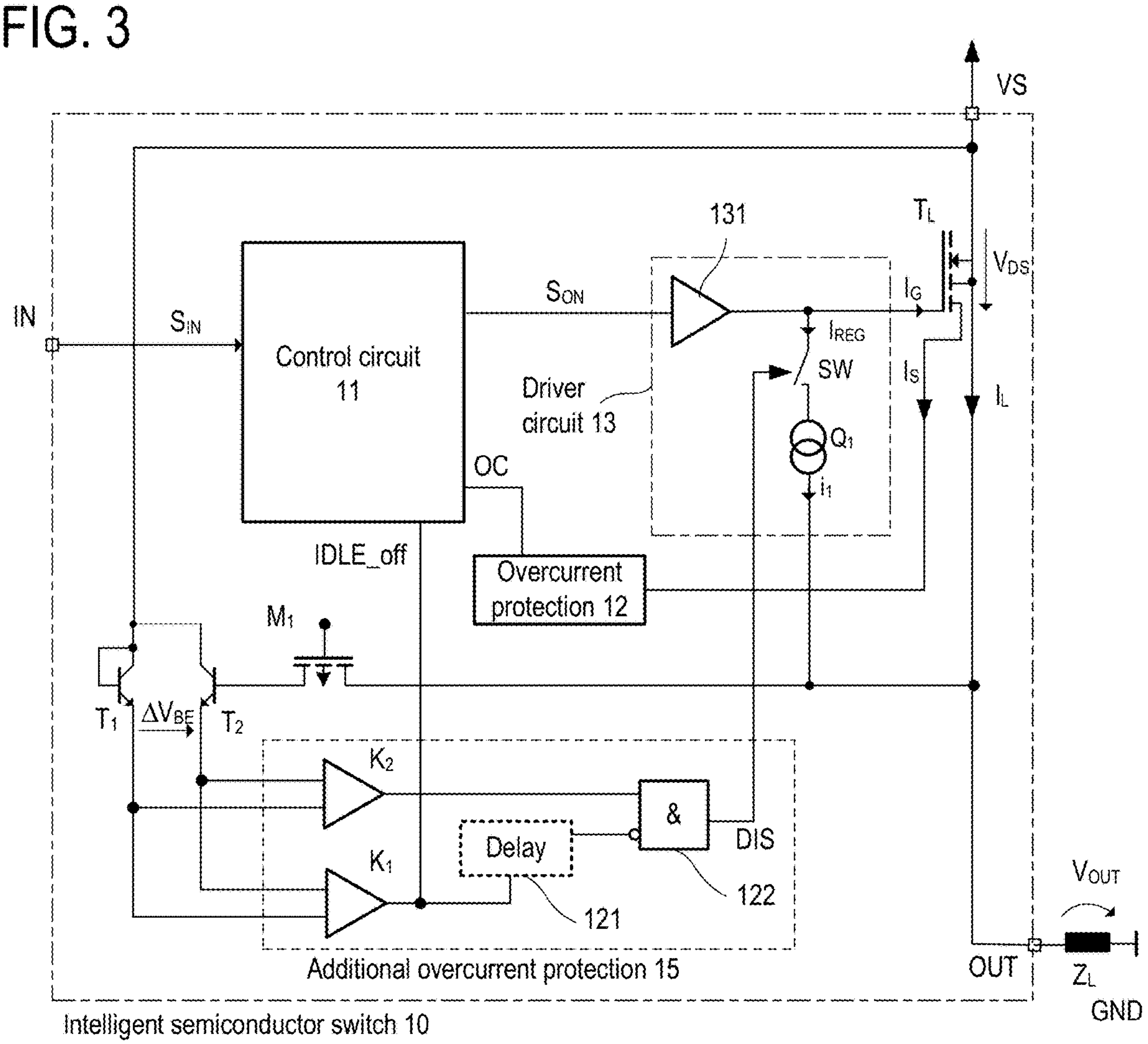
FIG. 4 illustrates another example of an intelligent semiconductor switch with a current limitation function in accordance with one or more techniques described herein.

FIG. 4 illustrates a more detailed example similar to the circuit of FIG. 3. The additional overcurrent protection 15 is connected between the source and the drain of the power transistor $T_L$ and comprises a first comparator $K_1$ and a second comparator $K_2$ which are configured to react to a sense signal $\Delta V_{BE}$ that is indicative of the load current $I_L$ passing through the power transistor $T_L$. The sense signal $\Delta V_{BE}$ is based on the voltage drop $V_{DS}$ across the power transistor $T_L$ ($\Delta V_{BE}$~drain-source voltage $V_{DS}$). Both comparators $K_1$ and $K_2$ are coupled to an input stage that outputs the sense signal $\Delta V_{BE}$, so that the difference between first and second inputs of each comparator is equal to the sense signal $\Delta V_{BE}$. Since both comparators receive the same inputs, their respective thresholds are related.

In the depicted example, the sense signal $\Delta V_{BE}$ is a voltage equal to the drain-source voltage $V_{DS}$ across the power transistor $T_L$. As the transistor $T_L$ is conductive (switched on) the drain-source voltage $V_{DS}$ equals $I_L$. $R_{ON}$, wherein $R_{ON}$ denotes the (known) on-resistance of the transistor $T_L$. Accordingly, $\Delta V_{BE} \sim I_L \cdot R_{ON}$, and thus $\Delta V_{BE}$ can be used as sense signal that represents the load current $I_L$.

The first comparator $K_1$ is configured to output a signal IDLE_off to the control circuit 11 when the sense signal $\Delta V_{BE}$ reaches or exceeds a first threshold Idle_thres_slow. Upon receiving a specific logic level (e.g. a High Level) of the signal IDLE_off, the control circuit 11 wakes up from idle-mode and initiates a mode change of the smart switch 10 from idle-mode the normal-mode. Specifically, it sends corresponding wake-up signals (not shown in the figures) to the other inactive circuits of the smart switch 10, in particular to the conventional overcurrent protection circuit 12. The wake-up signals are configured to cause the inactive circuits to be activated and to activate all functions of the smart switch 10. As already discussed with reference to FIG. 2, the transition between the idle-mode (first mode) and the normal-mode (second mode) takes a certain transition time $t_{transition}$ that begins with the sense signal reaching the first threshold Idle_thres_slow. The mode transition time depends on the reaction time of the different circuits and on the time it takes for the signals to propagate between the circuits.

In the present example, the first comparator $K_1$ has a first reaction time $t_1$. The reaction time t is an intrinsic parameter of the comparator $K_1$ and corresponds to the time period between an event and the signaling of this event by the comparator, i.e. the time it takes for the comparator to become active once the activating event has taken place. In the present example, the first reaction time t corresponds to the time it takes for the first comparator $K_1$ to output a level change of the signal IDLE_off to the control circuit 11 once the sense signal has reached the first threshold. Accordingly, the transition time of the smart switch 10 depends (amongst other parameters) on the first reaction time $t_1$.

The second comparator $K_2$ is configured to signal that the sense signal $\Delta V_{BE}$ reaches or exceeds a second threshold Idle_thres_fast and to cause a discharge signal DIS to be output to the driver circuit 13. The discharge signal leads to a reduction of the gate current $I_G$ that is applied to the gate electrode, as will be explained later. It is understood that the first and second thresholds are chosen dependent on the on-resistance $R_{ON}$ of the transistor $T_L$.

In the present example, the second threshold Idle_thres_fast is higher than the first threshold Idle_thres_slow. Further, the second comparator $K_2$ has a second reaction time $t_2$ that is shorter than the first reaction time $t_1$ of the first comparator $K_1$. In the present example, the second reaction time $t_2$ corresponds to the time it takes for the second comparator $K_2$ to signal a level change of the discharge signal to the driver circuit 13 once the sense signal $\Delta V_{BE}$ has reached the second threshold Idle_thres_fast. In the present example, the reaction time of the first comparator $K_1$ is at least 5 μs and, in particular, is between 5 and 10 μs. The reaction time of the second comparator $K_2$ is lower than 3 μs and, in particular, is between 1 and 2 μs. The first comparator $K_1$ is thus considered to be "slow". The comparator topology of the first comparator $K_1$ focuses on accuracy, with the tradeoff of a longer reaction time. The second comparator $K_2$ is, by contrast, considered to be "fast" (i.e. faster than the first comparator $K_1$). The comparator topology of the second comparator $K_2$ may be implemented with a high-gain folded cascade which allows a faster reaction time, wherein the tradeoff is that it is less accurate than the first comparator $K_1$.

Since the first comparator $K_1$ is very accurate, it can be ensured that the signal IDLE_off, which triggers the wake-up of the control circuit 11 and the mode change of the smart switch 10 to the normal-mode, is only sent when the first threshold has been reached. In particular, it can be ensured that the first comparator $K_1$ does not react to artifacts and that the switch 10 only changes to the normal-mode when the load current $I_L$ exceeds a certain limit represented by the comparator threshold of comparator $K_1$. Since the second comparator $K_2$ has a faster reaction time, it can react almost immediately once the second threshold has been reached, thereby increasing safety during the transition from the idle-mode to the normal-mode. The power transistor of the switch 10 can thus be efficiently protected from overcurrents during the transition time.

In the depicted example, the overcurrent protection circuit 15 also comprises a logic gate 122 that is configured to combine the output signals of the first comparator $K_1$ and the second comparator $K_2$. The logic gate 122 is configured to blank the output signal of the fast comparator $K_2$ as soon as the slow comparator $K_1$ initiates the transition from idle-mode to normal mode by generating the wakeup signal IDLE_off at an appropriate level. In the present example, the logic gate 122 is an AND-gate that outputs the discharge signal DIS when the fast comparator signals that the second threshold Idle_thres_fast has been reached provided that the first comparator has not yet detected the first threshold Idle_thres_slow. In other words, the output signal of the fast comparator $K_1$ is only forwarded, as discharge signal DIS, to the gate driver 13 when the first comparator $K_1$ does not yet signal that the sense signal $\Delta V_{BE}$ has reached the first threshold Idle_thres_slow. Such a situation may occur because of the difference between the first and the second reaction times $t_1$ and $t_2$. As will be discussed with reference to FIG. 6, in the case of fast load current transients, the second comparator $K_2$ may react before the first comparator $K_1$, even if the second threshold is higher than the first threshold. However, in the case of slow load current changes, if the signal IDLE_off has been output before the second threshold has been reached, the logic gate 122 is not activated and no discharge signal is output. The output of the second comparator $K_2$ can thus only be forwarded as long as the first comparator $K_1$ is not active (i.e. has not yet detected the condition $\Delta V_{BE} \geq$ Idle_thres_slow). With this, the output signal of the second comparator $K_2$ is only forwarded in cases of "acute" short-circuit conditions (i.e. a rapid load current increase), thereby avoiding that the power transistor $T_L$ be switched off following a "normal" load current change that is not harmful to the power transistor.

In essence, the discharge signal DIS output by the logic gate 122 only triggers a switch-off of the power transistor $T_L$ in response to a steep increase of the load current $I_L$. If the increase of the load current is "normal" (i.e. the usual consequence of the load $Z_L$ becoming active), the comparator $K_1$ will blank the output signal of the comparator $K_2$ with the help of the logic gate 122 before the comparator $K_2$ signals an overcurrent.

The additional overcurrent protection circuit 15 may also comprise an optional delay element 121 that is connected to the first comparator $K_1$ and that is configured to increase a propagation time of the output signal of the first comparator $K_1$ to the logic gate 122 by a predefined delay time. The delay time may be fixed or adjustable. This delay element 121 makes it possible to adjust the difference between the first and second reaction times of the comparators $K_1$ and $K_2$ and, in particular, to compensate for at least part of the mode transition time of the smart switch 10. As mentioned before, the mode transition time depends on the propagation time of the various signals and on the intrinsic reaction time of the different circuits of the smart switch 10.

In the present example, the input stage that outputs the sense signal $\Delta V_{BE}$ comprises a first transistor $T_1$ and a second transistor $T_2$. The transistors $T_1$ and $T_2$ are connected to the power transistor $T_L$ in such a way that a voltage difference $\Delta V_{BE}$ between an emitter voltage of the first transistor $T_1$ and an emitter voltage of the second transistor $T_2$ is equal (or proportional) to the source-drain voltage $V_{DS}$ across the power transistor $T_L$. In the present example, the first and second transistors $T_1$ and $T_2$ are bipolar transistors, wherein a base of the second transistor $T_2$ is connected to the drain of the power transistor $T_L$ and the collectors of the first and second transistors $T_1$ and $T_2$ are connected to the source of the power transistor $T_L$.

The positive temperature coefficient of the on-resistance $R_{ON}$ of the power transistor $T_L$ can (at least in part) be compensated by the input stage, so that the resulting voltage difference $\Delta V_{BE}$ is essentially independent of the temperature. With this, the first and second thresholds of the comparators can be constant over temperature, which increases the robustness of the smart switch 10 throughout a larger temperature range. As mentioned $\Delta V_{BE} \sim V_{DS} \sim I_L \cdot R_{ON}$, and therefore $\Delta V_{BE}$ can be used as sense signal that represents the load current $I_L$.

The first inputs of the first and second comparators $K_1$, $K_2$ are coupled to the emitter of the first transistor $T_1$, whereas the second inputs of the first and second comparators are coupled to the emitter of the second transistor $T_2$. With this, both comparators operate based on the same sense signal $\Delta V_{BE}$.

The driver circuit 13 comprises a driver 131 which generates a gate current $I_G$ (resulting in a respective gate voltage) to switch the transistor $T_L$ on and off in accordance with the control signal $S_{ON}$. Moreover, the driver circuit 13 is configured to activate a discharge current path, via which the gate electrode of the power transistor $T_L$ can be discharged to cause a fast switch-off of the transistor $T_L$. In the present example, the driver circuit 13 comprises a current source $Q_1$ that is arranged in the discharge current path and is connected to the gate of the power transistor $T_L$ via a switch SW. The current source $Q_1$ is configured to generate a current $i_1$. The switch SW is switched on and off in accordance with the discharge signal DIS. When the current source $Q_1$ is connected (by the switch SW) to the gate electrode of the power transistor $T_L$, a discharge current $I_{REG}$ flows through the discharge current path, thereby discharging the gate electrode and sinking the gate current $I_G$ by the current $I_{REG}$. It is understood that a resistor may be used instead of a current source $Q_1$. In one embodiment, a MOS transistor is used to implement switch and current source.

In the depicted example, the smart switch circuit 10 further comprises an electronic switch $M_1$ that is arranged between the drain of the power transistor $T_L$ and the additional overcurrent protection 15. The electronic switch $M_1$ is configured to connect the additional overcurrent protection 15 to the power transistor $T_L$ and to disconnect it therefrom. In the present example, the switch $M_1$ is a MOSFET. Furthermore, in the present example, the electronic switch $M_1$ is on when the smart switch circuit 10 is in the idle-mode, whereas the electronic switch $M_1$ is off once the smart switch 10 operates in the normal-mode (i.e. after the conventional overcurrent protection has been activated). Although not explicitly shown in the figure, the electronic switch $M_1$ can be switched on and off by the control circuit 11 dependent on the mode of operation. With this, it can be ensured that the additional overcurrent protection circuit 15 is only operative when the smart switch 10 (and the control circuit 11) is in the idle-mode or in the transition between the idle-mode and the normal-mode, thereby reducing the power consumption in the idle-state and ensuring that the overcurrent protection circuits 12, 15 do not disturb each other.

Figure 5:
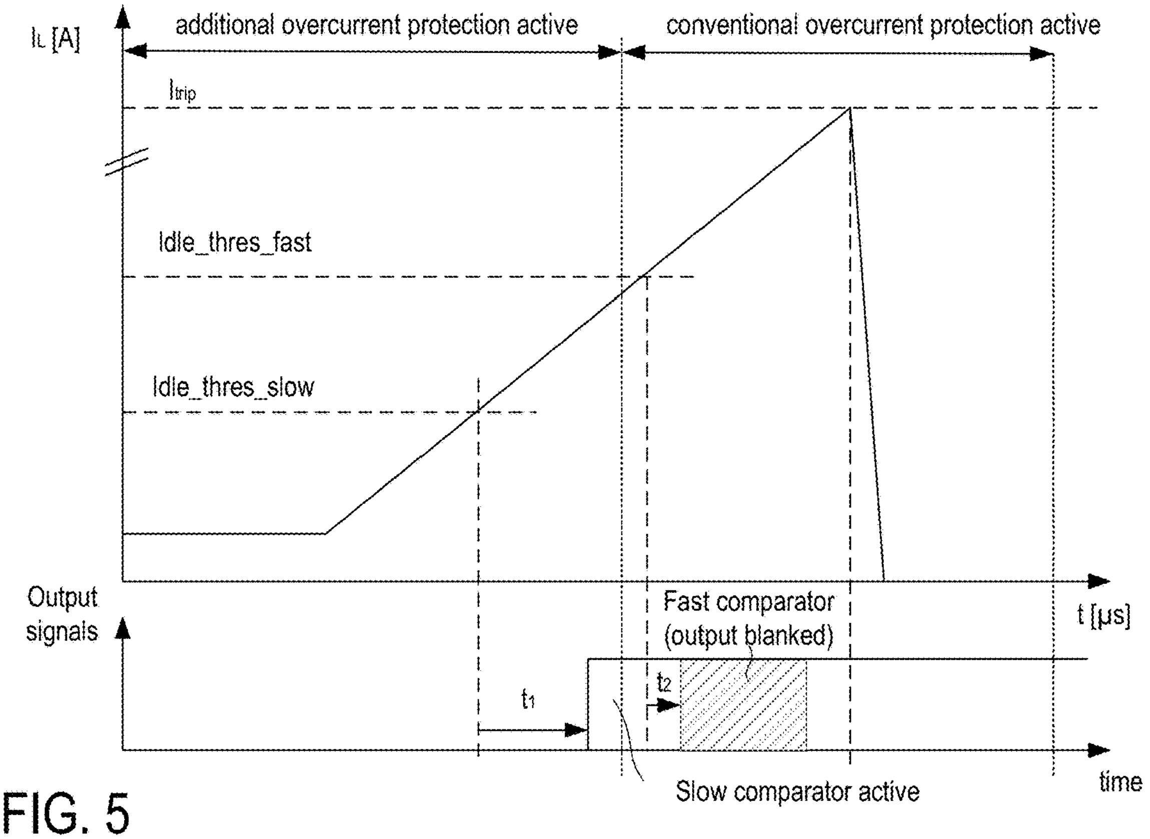
FIG. 5 is a timing diagram illustrating the behavior of the load current and of the outputs of the comparators in the example intelligent semiconductor switch of FIG. 4 in a first case in which the load current transient is slow, in accordance with one or more techniques described herein.
Figure 6:
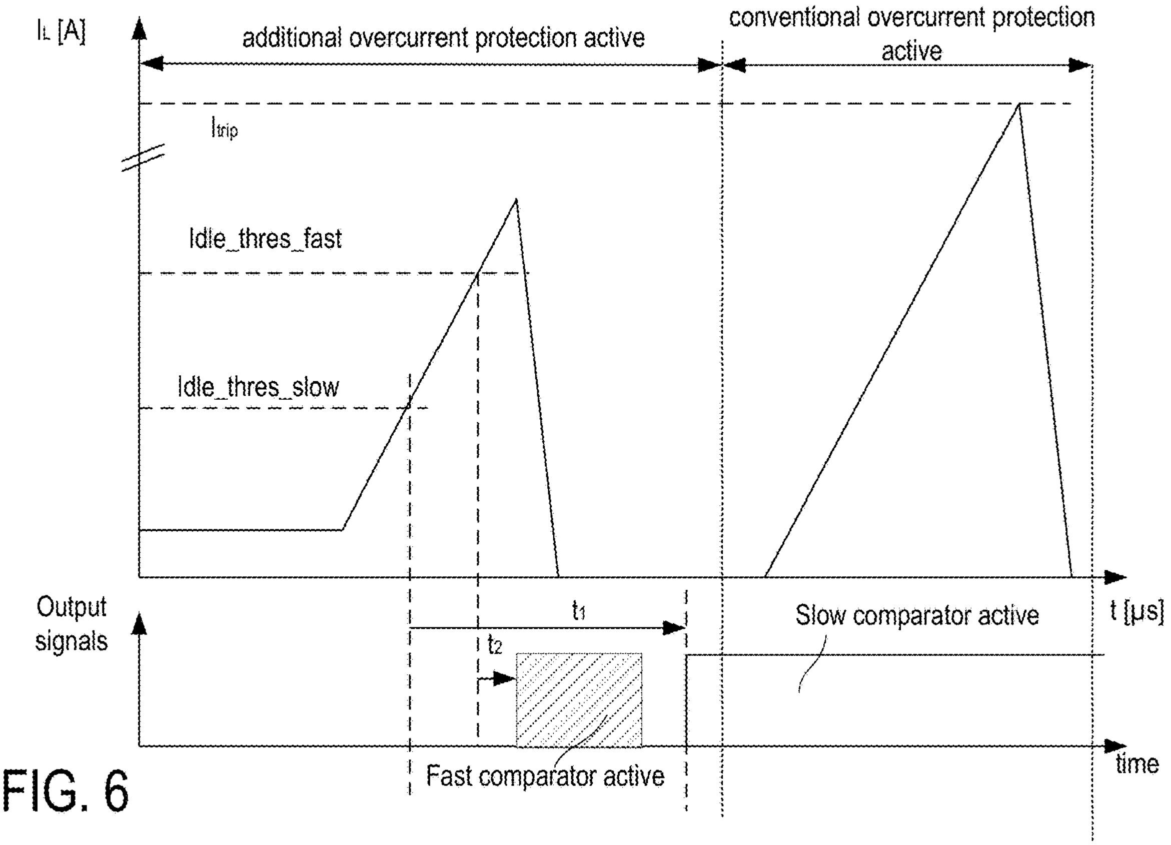
FIG. 6 is a timing diagram illustrating the behavior of the load current and of the outputs of the comparators in the example intelligent semiconductor switch of FIG. 4 in a second case in which the load current transient is fast, in accordance with one or more techniques described herein.

The behavior and function of the additional overcurrent protection circuit 15 is now explained with further details with reference to FIGS. 5 and 6.

FIG. 5 shows timing diagrams of the load current $I_L$ (upper diagram) and of the outputs of the comparators $K_1$ and $K_2$ (lower diagram) in the case in which the load current change is normal (i.e. relatively slow) during idle-mode and the transition to the normal-mode. Such load current changes can be the result of an intended load change (e.g. activation of load $Z_L$ from standby). In the present example, the load current slope is less than 10 A/µs, which is considered to be slow. When the load current reaches the first threshold Idle_thres_slow, the first comparator $K_1$ is triggered and the transition from the idle-mode to the normal-mode is initiated (by the signal IDLE_off, see FIG. 4). In particular, this event triggers the first reaction time $t_1$, at the end of which the output of the first comparator $K_1$ becomes active and provides the signal IDLE_off with, e.g., a High level. Similarly, when the load current reaches the second threshold Idle_thres_fast, the second comparator $K_2$ is triggered and the second reaction time $t_2$ begins, by the end of which the output of the second comparator $K_2$ is active (e.g. High level at comparator output). As can be seen in the lower diagram, the second reaction time $t_2$ is much shorter than the first reaction time $t_1$. In the example of FIG. 5, the first reaction time $t_1$ ends before the second reaction time $t_2$, so that the first comparator $K_1$ becomes active before the second comparator $K_2$. Thus, the logic gate 122 does blank the output signal of the fast comparator $K_2$ and the discharge signal is not output to the driver circuit 13.

Once the first comparator $K_1$ is active, it provides the output signal IDLE_off with, e.g., a High level to the control circuit 11, which causes the control circuit 11 to wake up from idle-mode and to send signals to the other inactive sub-circuits of the switch, in particular to the conventional overcurrent protection circuit, so that they become active. When all inactive functions of the smart switch are active, the transition period ends and the smart switch is in the normal-mode. In the normal-mode, when the load current reaches the third threshold $I_{trip}$, the conventional overcurrent protection circuit outputs the protection signal OC to the control circuit 11, and the control circuit 11 generates the control signal $S_{ON}$ that causes the driver circuit 13 to switch off the power transistor $T_L$. The subsequent decrease of the load current can also be seen in FIG. 5.

The additional overcurrent protection can be disabled as soon as the conventional overcurrent protection circuit becomes active after the transition into normal mode.

In the example of FIG. 5 ("slow" load current transient), the additional overcurrent protection circuit, although active at the beginning of the transition, does not come into operation and only the conventional overcurrent protection circuit actively protects the smart switch. Accordingly, the additional overcurrent protection circuit 15 does not interfere with the operation of the conventional overcurrent protection circuit 12.

FIG. 6 shows timing diagrams of the load current $I_L$ (upper diagram) and of the outputs of the comparators $K_1$ and $K_2$ (lower diagram) in another case, in which the load current change is fast during idle-mode, which is typically due to harsh short-circuit conditions. In the present example, the load current slope is more than 10 A/µs, which is considered to be fast. Contrary to the example of FIG. 5, the second reaction time $t_2$ of the second comparator $K_2$ ends before the first reaction time $t_1$ of the first comparator $K_1$, so that the second comparator $K_2$ is active before the first comparator $K_1$. Accordingly, the logic gate 122 does not blank the output signal of the second comparator $K_2$ and the power transistor $T_L$ can be actively protected for a given time by the additional overcurrent protection circuit. As a consequence, the discharge signal DIS is output to the driver circuit 13 and the gate current is decreased, which leads to a decrease of the load current and finally to a switch-off of the transistor, as shown in the time diagram of FIG. 6. Once the first reaction time $t_1$ ends, the first comparator $K_1$ becomes active and the conventional overcurrent protection circuit protects the device against re-occurring short-circuit events. The power transistor of the intelligent switch is thus actively protected by the additional overcurrent protection circuit until the first comparator $K_1$ and, as a consequence, the conventional overcurrent protection become active.

Figure 7B:
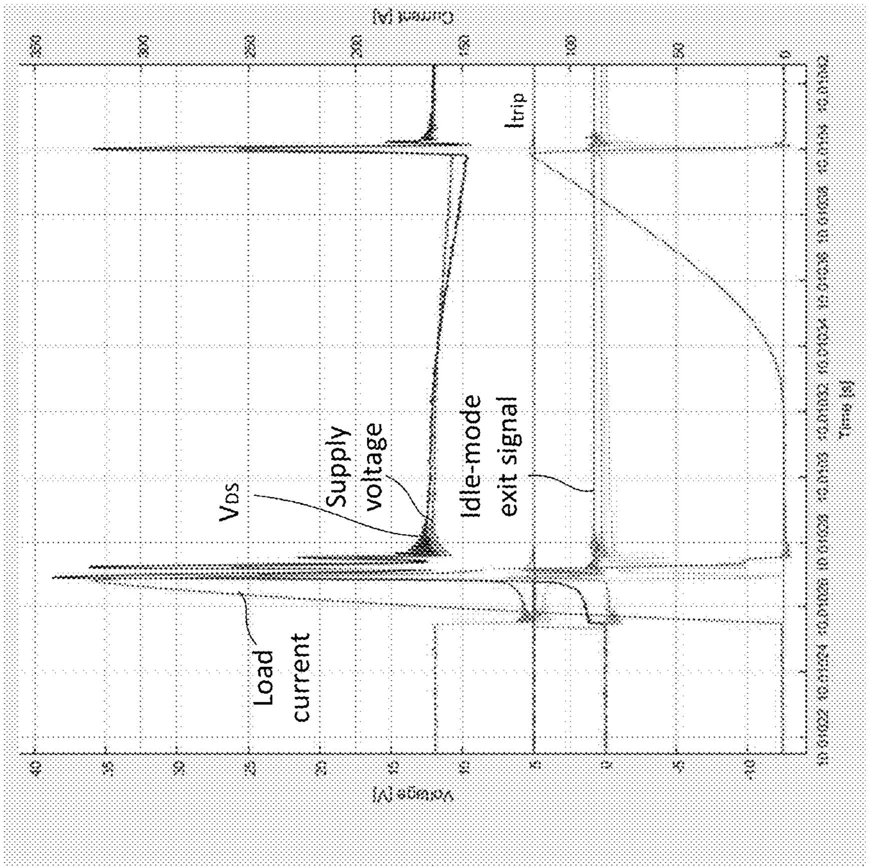
FIG. 7 shows experimental curves illustrating the behavior of several voltages and of the load current as a function of time (a) in a first case in which the load current transient is slow and (b) in a second case in which the load current transient is fast.
Figure 7A:
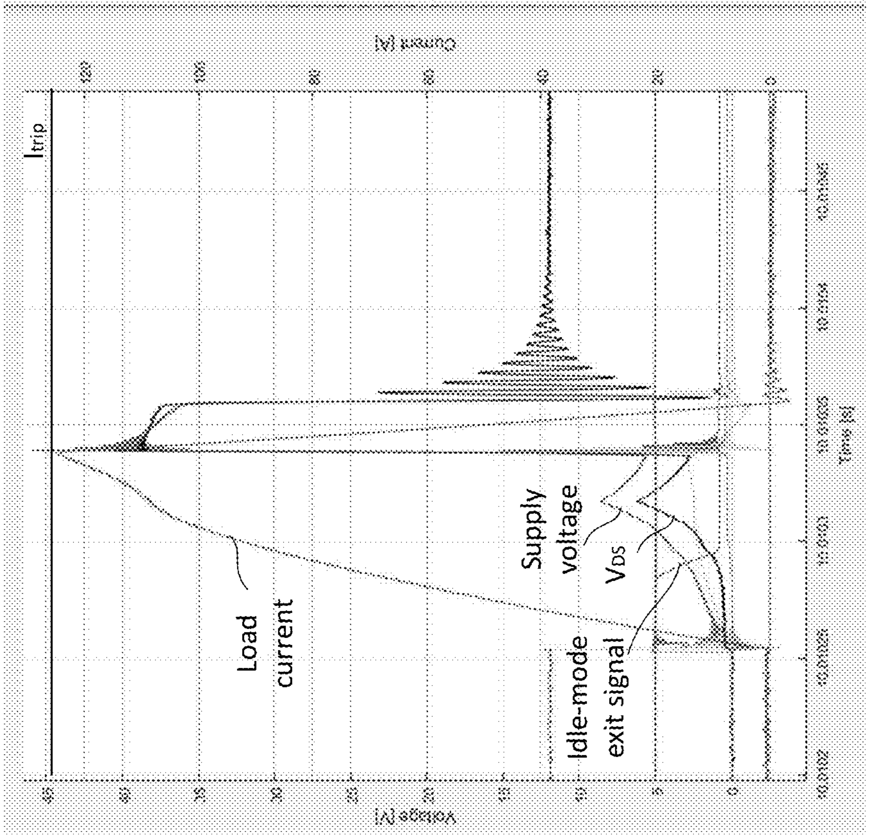

FIG. 7*a* shows experimental curves illustrating the behavior of several voltages and of the load current as a function of time in a first case, in which the load current transient is slow. This corresponds to the ideal case illustrated in FIG. 5.

In the present case, the slope of the load current $I_L$ is approximately 2.5 A/µs. When the load current reaches the first threshold, the transition to the normal-mode is initiated. However, the load current $I_L$ remains under the second threshold for the second comparator during the transition time and the additional overcurrent protection does not come into operation. Once the transition time is over, the power transistor of the smart switch is protected by the conventional overcurrent protection. In the present example, the conventional overcurrent protection sends a protection signal that leads to a reduction of the control current and to a switch-off of the power transistor, when the load current reaches the third threshold $I_{trip}$, which in this case is equal to 125 A.

FIG. 7*b* shows experimental curves illustrating the behavior of several voltage signals and of the load current $I_L$ as a function of time in a second case, in which the load current transient is fast. This corresponds to the ideal case illustrated in FIG. 6.

In the present case, the slope of the load current is approximately 25 A/µs. When the load current reaches the first threshold, the transition to the normal-mode is initiated. Since the current transient is very fast, the load current soon exceeds the second threshold, thereby activating the second comparator and the additional overcurrent protection circuit can trigger a switch-off of the power transistor $T_L$. Therefore, the additional overcurrent protection circuit then outputs a discharge signal that leads to a decrease of the load current and finally a switch-off of the power transistor. Once the transition to the normal-mode is over, the conventional overcurrent protection takes over the function of the additional overcurrent protection circuit.

Figure 8:
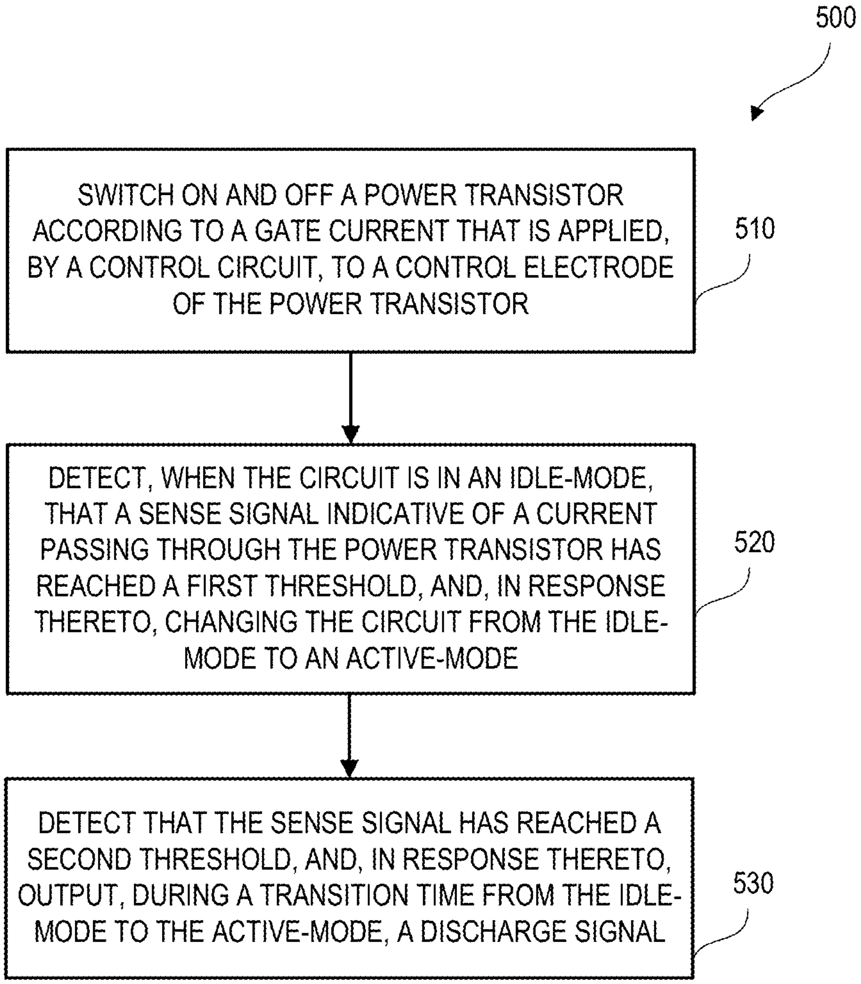
FIG. 8 is a flowchart illustrating an example method for operating an intelligent semiconductor switch, in accordance with one or more techniques described in this disclosure.

FIG. 8 is a flowchart illustrating an example method for operating an intelligent semiconductor switch and protecting it from overcurrents. The example process 500 can be employed to operate devices illustrated in this disclosure, such as the intelligent semiconductor switch according to FIGS. 3 and 4.

Process 500 includes switching on and off a power transistor $T_L$ of a circuit 10 according to a gate current $I_G$ that is applied, by a control circuit 11, to a gate electrode of the power transistor $T_L$ (step 510). In one example, the circuit 10 is a smart semiconductor switch. The circuit 10 can operate in a first mode (referred to as idle-mode), in which some functions of the circuit are inactive to reduce power consumption, and in a second mode (referred to as normal-mode or active mode), in which all functions of the smart switch are active. For example, the circuit may comprise a conventional overcurrent protection circuit that 12 is inactive in the idle-mode and that is active in the normal-mode. The conventional overcurrent protection circuit 12 is configured to send a signal that leads to a reduction of the load current when the load current exceeds a predefined threshold.

The process 500 further comprises detecting, when the circuit 10 is in the first mode (idle-mode), that a sense signal $\Delta V_{BE}$ indicative of a current $I_L$ passing through the power transistor $T_L$ has reached a first threshold, and, in response thereto, changing the circuit 10 from the first mode to the second mode (step 520). The sense signal $\Delta V_{BE}$ may be based on the drain-source voltage $V_{DS}$ across the power transistor $T_L$. The step of changing the circuit 10 from the first mode to the second mode requires a specific transition time that begins with the sense signal reaching the first threshold. This transition time is due to the intrinsic reaction times of the different sub-circuits of the circuit 10 and to the propagation times that are needed to propagate signals between the sub-circuits. In one example, detecting that the sense signal $\Delta V_{BE}$ has reached a first threshold comprises signaling, by a first comparator $K_1$, that the sense signal has reached the first threshold. The first comparator $K_1$ can then output a wakeup signal IDLE_off to a control circuit 11 of the circuit 10, which causes the control circuit 11 to initiate the mode change from idle-mode to normal-mode and to send activation signals to the inactive sub-circuits of the circuit 10, such as the conventional overcurrent protection circuit 12. Upon receiving these signals, the corresponding sub-circuits also become active. Once all the sub-circuits, which are inactive in the idle-mode, have become active, the transition is complete and the circuit is in the normal-mode.

The process 500 further comprises detecting that the sense signal has reached a second threshold, and, in response thereto, outputting, during the transition time, a discharge signal, which leads to a reduction of the gate current $I_G$ that is applied to the gate electrode (step 530). The second threshold may be higher than the first threshold. The detection of the sense signal reaching the second threshold thus occurs when the transition to the normal-mode has already begun. However, the discharge signal is only output if the transition is not yet over, namely, if the circuit 10 is not yet in the normal-mode. In one example, detecting that the sense signal has reached the second threshold comprises signaling, by a second comparator $K_2$, that the sense signal has reached the second threshold. In one example, reducing the gate current $I_G$ that is applied to the gate electrode comprises activating a discharge current path via which the gate electrode of the power transistor $T_L$ can be discharged. The discharge current path may comprise a current source that is connected to the gate electrode of the power transistor $T_L$ by a switch that is activated by the discharge signal. The first and the second comparators are part of an additional overcurrent protection circuit that is inactive in the normal-mode and that is active in the idle-mode.

In one example, the method further comprises combining output signals of the first comparator $K_1$ and the second comparator $K_2$, wherein the discharge signal is output when the second comparator $K_2$ signals that the sense signal has reached the second threshold, and the first comparator $K_1$ does not yet signal that the sense signal has reached the first threshold. The second comparator $K_2$ has an intrinsic reaction time that is shorter than the intrinsic reaction time of the first comparator $K_1$.

When the load current transient is sufficiently fast, the second comparator $K_2$ may provide an output signal before the first comparator $K_1$ provides its output signal due to the difference in reaction times between the comparators. In this case, the discharge signal is output and the power transistor is switched off. The circuit is thus actively protected by the additional overcurrent protection circuit during at least a part of the transition time. When the load current change is sufficiently slow, the first comparator $K_1$ provides its output signal before the second comparator $K_2$ can provide an output signal, and no discharge signal is output. Once the transition time is over, the additional overcurrent protection circuit becomes inactive and the protection of the circuit is ensured by the conventional overcurrent protection circuit. In one example, the process comprises delaying a propagation of the output signal of the first comparator $K_1$ by a predefined delay time. With this, it is possible to accommodate at least part of the reaction and propagation times of the sub-circuits in order to ensure that the circuit is always protected by one of the conventional and the additional overcurrent protection circuits.

The present application describes the use, in an intelligent semiconductor switch having a power transistor, of an additional overcurrent protection circuit that is active at least during idle-mode of the circuit. The additional overcurrent protection circuit is able to react to fast load current transients and has a low power dissipation. With this, it is possible to efficiently protect the circuit during the transition from idle-mode to normal-mode at a low power consumption. In particular, by using a logical combination of two comparators with the idle-threshold comparator, it is possible to distinguish between fast load current transients, which reflect a short circuit, and application-relevant load current changes, and thus to avoid any unintended interactions or unnecessary switch-offs of the power transistor. In particular, the additional overcurrent protection circuit only reacts in 'hard' short-circuit conditions.

Although the specification only describes the transition from the idle-mode to the normal-mode, it is clear that the circuits of FIGS. 3 and 4 can also be used in a similar way for the transition from the normal-mode to the idle-mode, wherein the additional overcurrent protection circuit is activated at the beginning of the transition and protects the intelligent switch during the transition and in the idle-mode. In particular, the first (slow) comparator $K_1$ of the additional overcurrent protection circuit may be used to enter the idle-mode and the second (fast) comparator $K_2$ may detect the fast load current transients after the conventional overcurrent protection has been deactivated.

Although various embodiments have been illustrated and described with respect to one or more specific implementations, alterations and/or modifications may be made to the illustrated examples without departing from the spirit and scope of the features and structures recited herein. With particular regard to the various functions performed by the above described components or structures (units, assemblies, devices, circuits, systems, etc.), the terms (including a reference to a "means") used to describe such components are intended to correspond—unless otherwise indicated—to any component or structure that performs the specified function of the described component (e.g., that is functionally equivalent), even if it is not structurally equivalent to the disclosed structure that performs the function in the herein illustrated exemplary implementations of the present disclosure.

What is claimed is:

1. A circuit comprising:

a power transistor connected between a supply terminal and an output terminal;

a control circuit coupled to a control electrode of the power transistor and configured to apply a control current to the control electrode to turn the power transistor on or off; and an overcurrent protection circuit connected to the power transistor, wherein the circuit is configured to operate in a first mode, in which some functions of the circuit are inactive to reduce power consumption, and in a second mode, in which all functions of the circuit are active, and the overcurrent protection circuit is configured to:

in response to the circuit being in the first mode and a sense signal indicative of a load current passing through the power transistor reaching a first threshold, cause the circuit to change from the first mode to the second mode, wherein the change from the first mode to the second mode has a specific transition time beginning with the sense signal reaching the first threshold, and in response to the sense signal reaching a second threshold, output, during the specific transition time, a discharge signal that leads to a reduction of the control current applied to the control electrode.

2. The circuit according to claim 1, wherein the sense signal is based on a drain-source-voltage across the power transistor.

3. The circuit according to claim 1, wherein the second threshold is higher than the first threshold.

4. The circuit according to claim 1, wherein the overcurrent protection circuit comprises:

a first comparator configured to signal that the sense signal has reached the first threshold; and a second comparator configured to signal that the sense signal has reached the second threshold.

5. The circuit according to claim 4, wherein the overcurrent protection circuit further comprises a logic gate configured to combine output signals of the first comparator and the second comparator.

6. The circuit according to claim 5, wherein the logic gate is configured to indicate a first condition, wherein the first condition comprises:

the second comparator signaling that the sense signal has reached the second threshold, and the first comparator not yet signaling that the sense signal has reached the first threshold.

7. The circuit according to claim 6, wherein the discharge signal is output in response to the logic gate indicating that the first condition is met.

8. The circuit according to claim 5, wherein:

the first comparator has a first reaction time;

the second comparator has a second reaction time; and the first reaction time is longer than the second reaction time.

9. The circuit according to claim 8, wherein the first reaction time of the first comparator is at least 5 μs.

10. The circuit according to claim 8, wherein the second reaction time of the second comparator is less than 3 μs.

11. The circuit according to claim 8, wherein the overcurrent protection circuit further comprises:

a delay element connected to the first comparator and configured to delay propagation of the output signal of the first comparator to the logic gate by a predefined delay time.

12. The circuit according to claim 1, further comprising:

a driver circuit, wherein the discharge signal is configured to cause the driver circuit to activate a discharge current path through which the control electrode of the power transistor can be discharged.

13. The circuit according to claim 1, further comprising:

a further overcurrent protection circuit that is configured to:

when the circuit is in the second mode, receive a further sense signal different from the sense signal, and when the circuit is in the second mode, output a protection signal that leads to the reduction of the control current applied to the control electrode based on a value of the further sense signal.

14. The circuit according to claim 13, wherein the further overcurrent protection circuit is inactive when the circuit is in the first mode.

15. The circuit according to claim 13, wherein the further overcurrent protection circuit is configured to output the protection signal in response to the further sense signal reaching a third threshold.

16. The circuit according to claim 15, wherein the third threshold corresponds to a load current value that is higher than the load current value represented by the second threshold.

17. A method comprising:

switching on and off a power transistor of a circuit according to a control current applied to a control electrode of the power transistor, wherein the circuit is configured to operate in a first mode, in which some functions of the circuit are inactive to reduce power consumption, and in a second mode, in which all functions of the circuit are active;

detecting, when the circuit is in the first mode, that a sense signal indicative of a load current passing through the power transistor has reached a first threshold, and, in response thereto, changing the circuit from the first mode to the second mode, wherein the change from the first mode to the second mode has a specific transition time that begins with the sense signal reaching the first threshold; and detecting that the sense signal has reached a second threshold, and, in response thereto, outputting, during the specific transition time, a discharge signal which causes a reduction of the control current applied to the control electrode.

18. The method of claim 17, further comprising at least one of:

signaling, by a first comparator, that the sense signal has reached the first threshold; and signaling, by a second comparator, that the sense signal has reached the second threshold.

19. The method of claim 18, further comprising:

combining output signals of the first comparator and the second comparator, wherein a discharge current is sent when:

the second comparator signals that the sense signal has reached the second threshold, and the first comparator does not yet signal that the sense signal has reached the first threshold.

20. The method according to claim 18, further comprising:

delaying a propagation of an output signal of the first comparator by a predefined delay time.

21. The method according to claim 17, wherein reducing the control current applied to the control electrode comprises:

activating a discharge current path via which the control electrode of the power transistor can be discharged.

* * * * *